US012803454B2

(12) United States Patent
Casci et al.

(10) Patent No.: US 12,803,454 B2
(45) Date of Patent: Nov. 17, 2026

(54) BUS BAR AND CAPACITOR FOR TRACTION INVERTER

(71) Applicant: Ford Global Technologies, LLC, Dearborn, MI (US)

(72) Inventors: John Casci, Canton, MI (US); Fan Wang, Novi, MI (US); Baoming Ge, Okemos, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 325 days.

(21) Appl. No.: 18/487,825

(22) Filed: Oct. 16, 2023

(65) Prior Publication Data

US 2025/0125740 A1 Apr. 17, 2025

(51) Int. Cl.
*H02M 7/00* (2006.01)
*H05K 7/14* (2006.01)

(52) U.S. Cl.
CPC ........ *H02M 7/003* (2013.01); *H05K 7/14329* (2022.08)

(58) Field of Classification Search
CPC ........................... H02M 7/003; H05K 7/14329
See application file for complete search history.

(56) References Cited

U.S. PATENT DOCUMENTS

| | | | | |
|---|---|---|---|---|
| 4,689,718 | A * | 8/1987 | Maue | B60R 16/0238 439/511 |
| 4,930,045 | A * | 5/1990 | Carlson | H01G 4/38 361/689 |
| 11,678,468 | B2 | 6/2023 | Blanchard St-Jacques et al. | |
| 2017/0063203 | A1 | 3/2017 | Doo | |
| 2021/0143746 | A1* | 5/2021 | Aoyagi | H02M 7/5387 |
| 2023/0230905 | A1 | 7/2023 | Luniewski et al. | |

FOREIGN PATENT DOCUMENTS

| | | | |
|---|---|---|---|
| EP | 1663687 | B1 | 4/2012 |

* cited by examiner

*Primary Examiner* — Gary L Laxton
(74) *Attorney, Agent, or Firm* — McCoy Russell LLP

(57) ABSTRACT

Systems and methods for constructing a traction inverter of a vehicle are described. The traction inverter includes a positive bus bar and a negative bus bar that couple a capacitor and to a plurality of switches. The capacitor is formed from a plurality of individual capacitors that are stacked together.

20 Claims, 6 Drawing Sheets

BUS BAR AND CAPACITOR FOR TRACTION INVERTER

FIELD

The present description relates to methods and a system for building a traction inverter that includes a capacitor with bus bars for an electric or a hybrid vehicle. The methods and systems may be particularly useful for vehicles that include a lower voltage battery and a higher voltage traction battery.

BACKGROUND AND SUMMARY

An electric or hybrid vehicle may include an inverter that may convert direct current (DC) output of a traction battery to alternating current (AC) that powers a traction motor. The inverter may also convert AC power into DC power during periods when a vehicle's kinetic energy is converted into electrical energy to slow the vehicle. The inverter may include transistors that are operated as switches to convert DC to AC or vice-versa. The inverter may also include a capacitor that filters electric power that is exchanged between the traction battery and the switches. The capacitance of the capacitor and the power requirements of the capacitor may result in a separation of bus positive and negative bus bars between the positive and negative terminals of the capacitor. The separation in bus bars may increase stray inductance of the inverter circuitry. The inductance may cause voltage spikes within the inverter that have to be tolerated by power cards that include transistors and other components. Consequently, the power cards may be designed with components that tolerate the voltage spikes but increase the financial expense of the power cards.

BRIEF DESCRIPTION OF THE DRAWINGS

The advantages described herein will be more fully understood by reading an example of an embodiment, referred to herein as the Detailed Description, when taken alone or with reference to the drawings, where.

DETAILED DESCRIPTION

Figure 1:
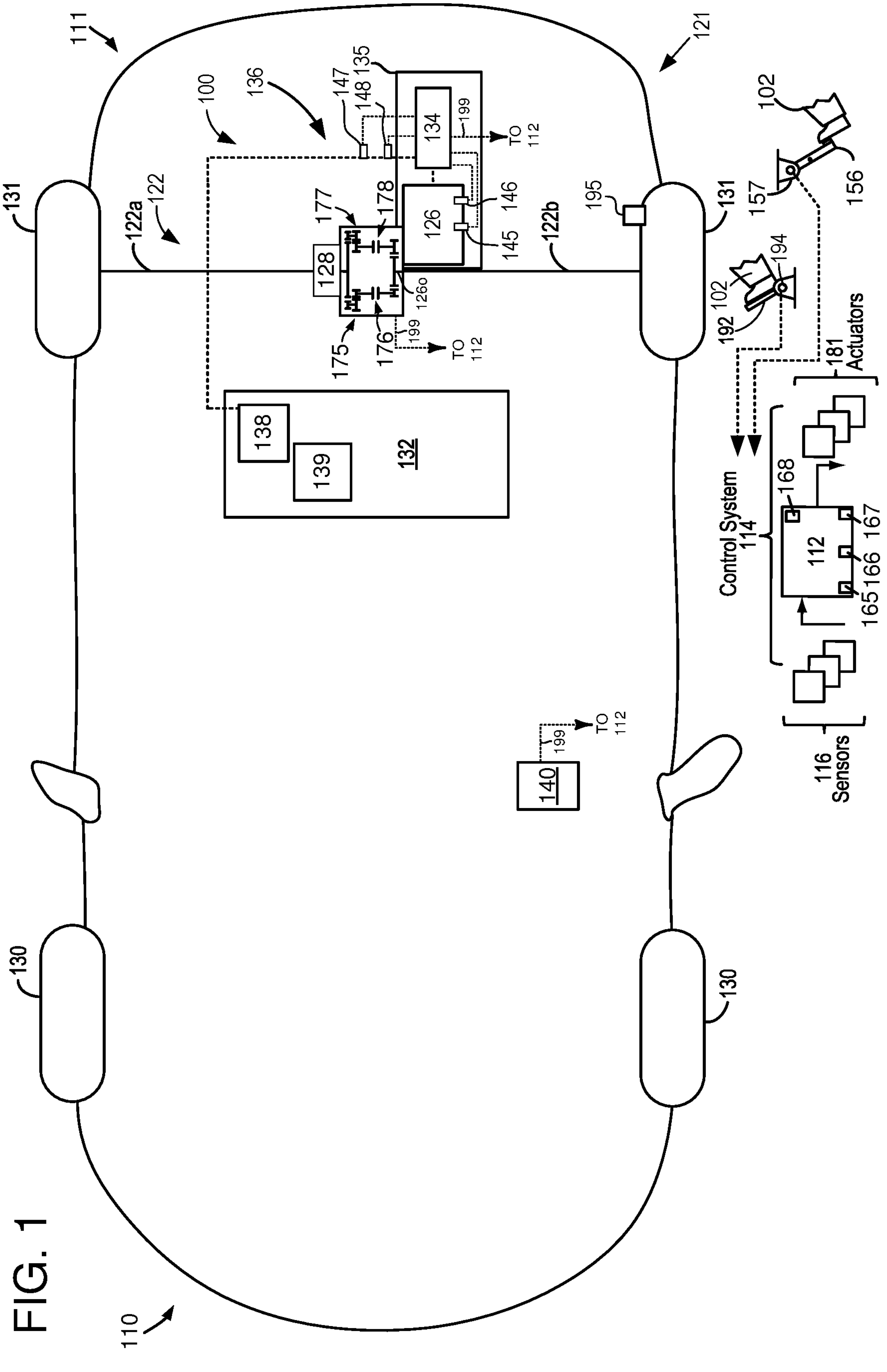
FIG. 1 is a schematic view of an example electric vehicle.

The present description is related to building an inverter for an electric traction machine. The inverter includes a capacitor and bus bar arrangement that may lower inductance so that lower capacity power cards may be included in the inverter. The inverter may be included in an electric vehicle as shown in FIG. 1, or alternatively, in a hybrid vehicle. The inverter may be of the type shown in FIG. 2, or similar designs. The inverter may include a capacitor and bus bars as shown in FIGS. 3-6. The capacitor and bus bars may be produced according to the method of FIG. 7.

FIG. 3-6 are drawn approximately to scale, aside from the schematically depicted components. However, the inverter assembly may have other relative components dimensions in alternate embodiments.

Presently, inverters may include a capacitor assembly that is distinctly physically separated from the inverter's power module assembly (e.g., switching power transistors that transfer power between DC and AC power sources). The physical separation may be overcome via positive (+) and negative (−) bus bars, which allow electric power to be transferred between the capacitor and the power module assemblies. However, the positive and negative terminals of the capacitor may be separated by a considerable distance, and this distance leads to separation between the positive and negative bus bars. Separation between the positive and negative bus bars may increase bus bar resistance, increase bus bar temperature, and increase stray inductance. Further, larger bus bars that span the distance between positive and negative terminals of the capacitor may result in cantilevered loads, which may make it more difficult for the inverter assembly to meet vibration metrics. The larger bus bars may also increase packaging size and inverter mass, which may not be desired.

The inventors herein have recognized the above-mentioned issues and have developed a traction inverter, comprising: a plurality of stacked capacitors, each of the plurality of stacked capacitors including a positive lead and a negative lead; a first bus bar including pass through slots for the positive leads and negative leads of each of the plurality of stacked capacitors; and a second bus bar including pass through slots for solely the positive leads or for solely negative leads of each of the plurality of stacked capacitors.

By stacking capacitors and passing capacitor leads through at least one bus bar, it may be possible to provide the technical result of lowering inverter stray inductance and resistance. Further, the volume, mass, and expense of the inverter may be reduced. In particular, stacked capacitors arranged in parallel may provide a desired capacitance and the bus bars may be proximate to each other so as to reduce stray inductance between the bus bars. In addition, power cards may be fixed directly to one of the bus bars so that the bus bars surface area and mass may be reduced.

The present description may provide several advantages. In particular, the approach may decrease stray inductance between positive and negative bus bars so that power modules with lower voltage ratings may be utilized. Further, the approach may lower the financial expense and mass of a traction inverter so that vibration durability may increase. Additionally, the lower inductance may allow the inverter to switch at higher speeds and generate fewer losses.

The above advantages and other advantages, and features of the present description will be readily apparent from the following Detailed Description when taken alone or in connection with the accompanying drawings.

It may be understood that the summary above is provided to introduce in simplified form a selection of concepts that are further described in the detailed description. It is not meant to identify key features of the claimed subject matter, the scope of which is defined uniquely by the claims that follow the detailed description. Furthermore, the claimed subject matter is not limited to implementations that solve any disadvantages noted above or in any part of this disclosure.

FIG. 1 is a block diagram of a vehicle 121 including a powertrain or driveline 100. A front portion of vehicle 121 is indicated at 110 and a rear portion of vehicle 121 is indicated at 111. Driveline 100 includes electric machine 126. Electric machine 126 may consume or generate electrical power depending on its operating mode. Throughout the description of FIG. 1, mechanical connections between various components are illustrated as solid lines, whereas electrical connections between various components are illustrated as dashed lines.

Driveline 100 has a rear axle 122. In some examples, rear axle 122 may comprise two half shafts, for example first half shaft 122*a*, and second half shaft 122*b*. Driveline 100 also includes front wheels 130 and rear wheels 131. Rear wheels 131 may be driven via electric machine 126.

The rear axle 122 is coupled to electric machine 126. Rear drive unit 136 may transfer power from electric machine 126 to axle 122 resulting in rotation of rear wheels 131. Rear drive unit 136 may include a low gear 175 and a high gear 177 that are coupled to electric machine 126 via output shaft 1260 of electric machine 126. Low gear 175 may be engaged via fully closing low gear clutch 176. High gear 177 may be engaged via fully closing high gear clutch 178. High gear clutch 178 and low gear clutch 176 may be opened and closed via commands received by rear drive unit 136 over controller area network (CAN) 199. Alternatively, high gear clutch 178 and low gear clutch 176 may be opened and closed via digital outputs or pulse widths provided via control system 114. Rear drive unit 136 may include differential 128 so that torque may be provided to first half shaft 122*a* and to second half shaft 122*b*. In some examples, an electrically controlled differential clutch (not shown) may be included in rear drive unit 136.

Electric machine 126 may receive electrical power from onboard electric energy storage device 132. Furthermore, electric machine 126 may provide a generator function to convert the vehicle's kinetic energy into electrical energy, where the electrical energy may be stored at electric energy storage device 132 for later use by electric machine 126. An inverter 134 may convert alternating current generated by electric machine 126 to direct current for storage at the electric energy storage device 132 and vice versa. Electric drive system 135 includes electric machine 126 and inverter 134. Electric energy storage device 132 may be a traction battery (e.g., a battery that supplies power to propel a vehicle), capacitor, inductor, or other electric energy storage device. Electric power flowing into electric drive system 135 may be monitored via current sensor 145 and voltage sensor 146. Position and speed of electric machine 126 may be monitored via position sensor 147. Torque generated by electric machine 126 may be monitored via torque sensor 148.

In some examples, electric energy storage device 132 may be configured to store electrical energy that may be supplied to other electrical loads residing on-board the vehicle (other than the motor), including cabin heating and air conditioning, engine starting, headlights, cabin audio and video systems, etc.

Control system 114 may communicate with electric machine 126, electric energy storage device 132, etc. Control system 114 may receive sensory feedback information from electric drive system 135 and electric energy storage device 132, etc. Further, control system 114 may send control signals to electric drive system 135 and electric energy storage device 132, etc., responsive to this sensory feedback. Control system 114 may receive an indication of an operator requested output of the vehicle propulsion system from a human operator 102, or an autonomous controller. For example, control system 114 may receive sensory feedback from pedal position sensor 194 which communicates with pedal 192. Pedal 192 may refer schematically to a driver demand pedal. Similarly, control system 114 may receive an indication of an operator requested vehicle slowing via a human operator 102, or an autonomous controller. For example, control system 114 may receive sensory feedback from pedal position sensor 157 which communicates with vehicle slowing pedal 156.

Electric energy storage device 132 may periodically receive electrical energy from a power source such as a stationary power grid (not shown) residing external to the vehicle (e.g., not part of the vehicle). As a non-limiting example, driveline 100 may be configured as a plug-in electric vehicle (EV), whereby electrical energy may be supplied to electric energy storage device 132 via the power grid (not shown).

Electric energy storage device 132 includes an electric energy storage device controller 139 and a power distribution module 138. Electric energy storage device controller 139 may provide charge balancing between energy storage element (e.g., battery cells) and communication with other vehicle controllers (e.g., controller 112). Power distribution module 138 controls flow of power into and out of electric energy storage device 132.

One or more wheel speed sensors (WSS) 195 may be coupled to one or more wheels of driveline 100. The wheel speed sensors may detect rotational speed of each wheel. Such an example of a WSS may include a permanent magnet type of sensor.

Controller 112 may comprise a portion of a control system 114. In some examples, controller 112 may be a single controller of the vehicle. Control system 114 is shown receiving information from a plurality of sensors 116 (various examples of which are described herein) and sending control signals to a plurality of actuators 181 (various examples of which are described herein). As one example, sensors 116 may include tire pressure sensor(s) (not shown), wheel speed sensor(s) 195, etc. In some examples, sensors associated with electric machine 126, wheel speed sensor 195, etc., may communicate information to controller 112, regarding various states of electric machine operation. Controller 112 includes non-transitory (e.g., read exclusive memory) 165, random access memory 166, digital inputs/outputs 168, and a microcontroller 167. Controller 112 may receive input data and provide data to human/machine interface 140 via CAN 199.

Figure 2:
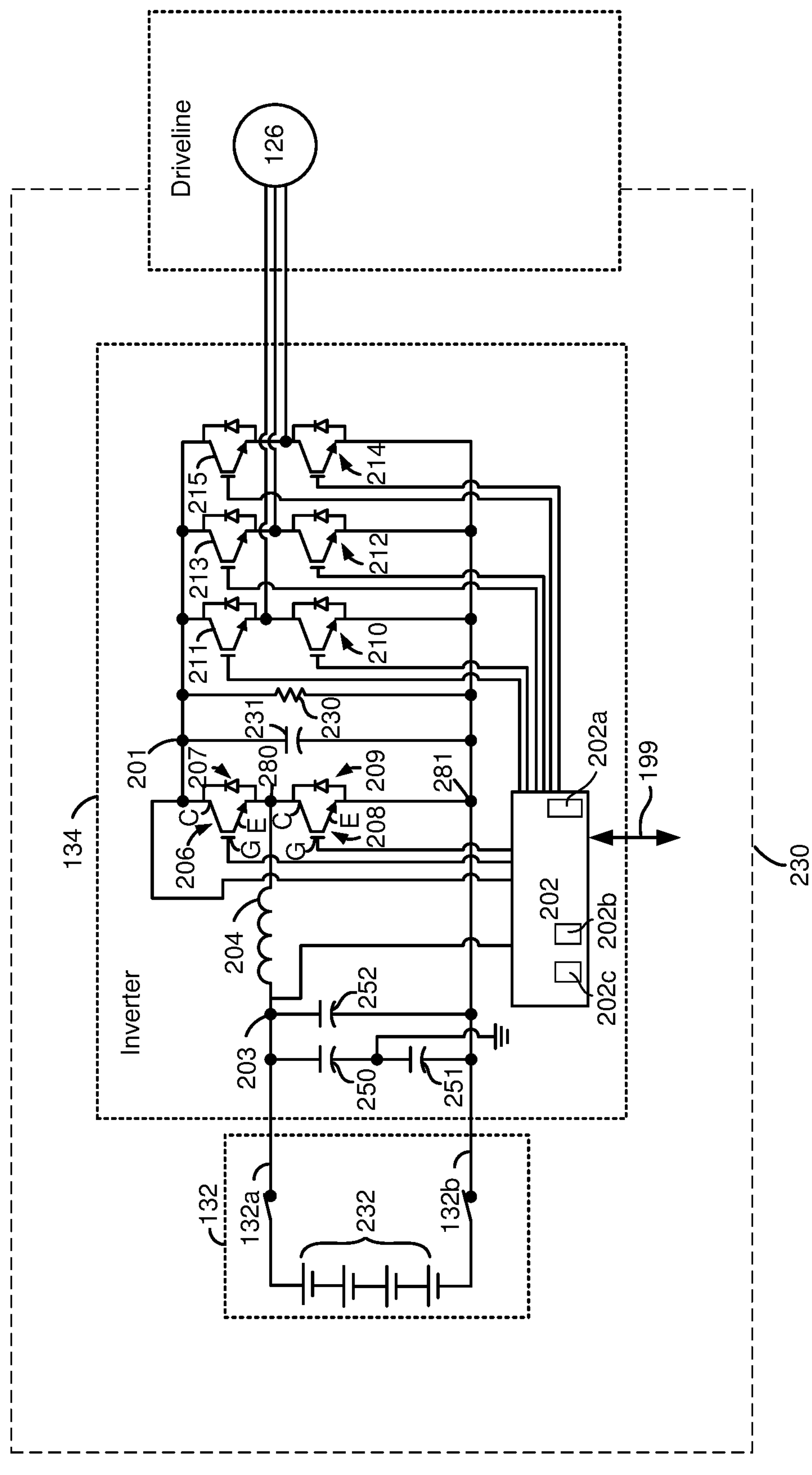
FIG. 2 is a schematic diagram of an example inverter.

Referring now to FIG. 2, inverter 134 is shown electrically coupled to electric energy storage device 132 (e.g., battery). In this example, electric energy storage device includes a plurality of battery cells 232 that are connected in series to increase a voltage of electric energy storage device 132. Inverter 134 is also shown being electrically coupled to electric machine 126 (e.g., a three phase electric machine that may be operated as a motor or alternator). Inverter 134 includes a controller 202 that may communicate with controller 112 shown in FIG. 1 via controller area network (CAN) 199. Controller 202 is electrically coupled to bases of transistors 206, 208, and 210-215. Controller 202 may supply control signals to independently activate and deactivate transistors 206, 208, and 210-215. Controller 202 includes inputs and outputs 202*a* (e.g., digital inputs, digital outputs, analog inputs, analog outputs), memory 202*b* (e.g., read exclusively, electrically erasable memory, transitory memory RAM), and processor 202*c*. Controller 202 may sense voltage at node 203 and current flow through inductor 204 via current sensor 299.

Transistors 206, 208, and 210-215 are shown as insulated gate bipolar transistors (IGBT), but in alternative configurations, they may be metal oxide field effect transistors (MOSFETs), field effect transistors (FETs), or other known types of transistors. Controller 202 may activate IGBTs via supplying a higher potential voltage to gates of transistors 206, 208, and 210-215. Controller 202 may deactivate IGBTs via supplying a lower potential voltage to gates of transistors 206, 208, and 210-215. Gates of transistors 206 and 208 are indicted by the letters "G." Collectors of transistors 206 and 208 are indicated by letters "C." Emitters of transistors 206 and 208 are indicated by letters "E." Transistors 210-215 have similar bases, emitters, and collectors as indicated for transistors 206 and 208. Transistors 206 and 208 also include diodes 207 and 209, which are forward biased between the respective emitters and collectors. Current may flow between the collectors and the emitters of transistors 206 and 208 when they are activated. Current flow between the collectors and emitters of transistors 206 and 208 is prevented when transistors 206 and 208 are deactivated. Transistors 210-215 operate similarly. Transistors 210-215 may be selectively activated and deactivated to convert DC to AC.

Inductor 204 is shown directly electrically coupled to transistors 206 and 208. Inductor 204 is also directly electrically coupled to capacitor 250, capacitor 252, and electric energy storage device 132. Capacitor 251 is shown electrically coupled to capacitor 250 and a negative side of electric energy storage device 132.

In a boost mode, controller 202 may selectively activate transistor 208, which may be referred to as a boost transistor, to charge inductor 204 via charge provided by electric energy storage device 132 from positive terminal 133*a*. Inductor 204 impedes current flow as it begins to store electric energy in a magnetic field. The polarity of the left hand side of inductor 204 is positive when boost transistor 208 is closed. Current flow through inductor 204 is reduced and its magnetic field begins to reduce when boost transistor 208 is opened. The polarity of inductor 204 changes so that the right side of inductor 204 has the positive polarity as its reducing magnetic field supports continuing current flow to the load. The voltage of electric energy storage device 132 and the voltage developed across inductor 204 are connected in series, thereby providing the voltage of electric energy storage device 132 plus the voltage of inductor 204 at node 280. The voltage at node 280 less a small voltage drop across diode 207 develops at node 201, which is the output of the variable voltage control inverter boost circuit and input to transistors 210-215 when VVC is operating in a boost mode, since diode 207 is forward biased. Charge may be stored in capacitor 231 to smooth the output voltage of the boost circuit at node 201. The voltage at node 201 is a DC voltage. The variable voltage control inverter boost circuit may include capacitors 250-252, inductor 204, boost transistor 208, diode 209, diode 207, capacitor 231, and resistor 230. The voltage at node 201 is supplied to transistors 210-215 which switch on and off to provide three phase AC power to electric machine 126. Buck transistor 206 is commanded deactivated whenever boost transistor 208 is commanded activated so as to prevent short circuiting between node 201 and node 281.

If a small amount of power is requested of electric machine 126, battery voltage minus small voltage drops for inductor 204 and diode 207 may be supplied at node 201 by deactivating buck transistor 206 and boost transistor 208.

In a buck mode, charge is supplied to inductor 204 via electric machine 126. In particular, three phase AC output of electric machine is converted into a DC voltage at node 201 via switching of transistors 210-215 by controller 202. Inductor 204 is charged via activating transistor 206, which may be referred to as a buck transistor. Inductor 204 impedes current flow as it begins to store electric energy in a magnetic field. The polarity of the right hand side of inductor 204 is positive when boost transistor 206 is closed. Current flow through inductor 204 is reduced and its magnetic field begins to reduce when buck transistor 206 is opened. The polarity of inductor 204 changes so that the left side of inductor 204 has the positive polarity as its reducing magnetic field supports continuing current flow to the load (e.g., electric energy storage device 132). The amount of time inductor 204 is allowed to charge is controlled so that voltage that develops across inductor 204 is less than voltage output via the electric machine 126. Diode 209 couples the right side of inductor 204 to node 281, which is coupled to negative battery terminal 133*b*. The voltage developed across inductor 204 is connected to positive terminal 133*a* of electric energy storage device 132. Charge from inductor 204 flows to terminal 133*a* so that the electric energy storage device may charge. The voltage at node 203 is controlled via adjusting the amount of time buck transistor 206 is activated (e.g., closed to allow current flow through the transistor). Boost transistor 208 is deactivated (e.g., opened to inhibit current flow through the transistor) whenever buck transistor 206 is activated. Charge may be stored in capacitors 250-252 to smooth the output voltage of the buck circuit at node 203. The voltage at node 203 is a DC voltage. The variable voltage control inverter buck circuit may include capacitors 250-252, inductor 204, buck transistor 206, diode 209, capacitor 231, and resistor 230. Voltage and node 203 is the output voltage of the variable voltage control inverter buck circuit. Controller 202 may monitor voltages at nodes 203 and 201. Further, controller 202 may adjust the duty cycle of signals supplied to boost transistor 208 and buck transistor 206 responsive to voltages at nodes 203 and 201.

Figure 3:
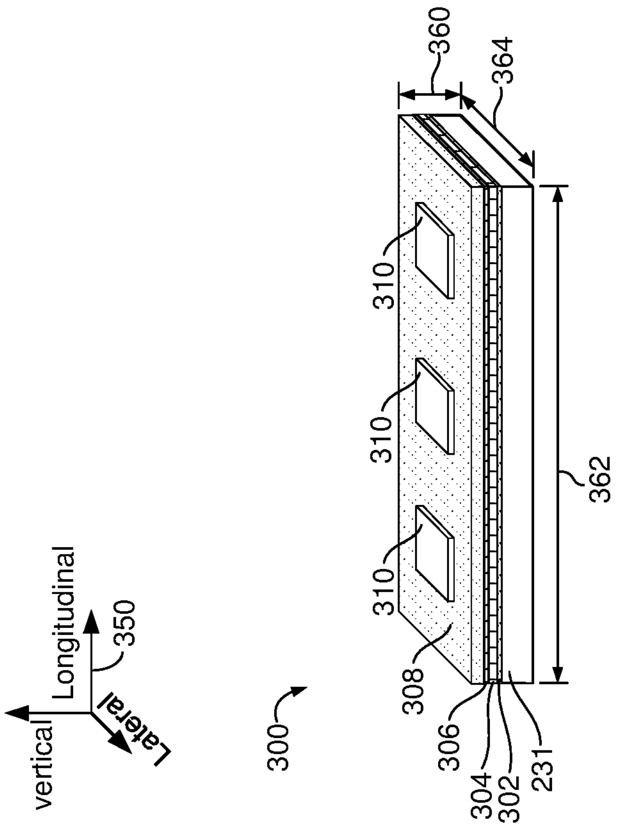

Referring now to FIG. 3, an assembled view of a capacitor block, bus bars, and power cards for inverter 134 is shown. The capacitor block 231, first insulator 302, first bus bar 304, second insulator 306, and second bus bar 308 may be fastened together via an adhesive. Alternatively, the leads (not shown) of capacitor block 231 may be fastened (e.g., via welding, sintering, soldering, or brazing, all of which may be referred to herein as welding) to first bus bar 304 and second bus bar 308 to hold the capacitor block 231, first insulator 302, first bus bar 304, second insulator 306, and second bus bar 308 together.

The vertical, longitudinal, and lateral directions of inverter assembly 300 are as indicated at 350. Capacitor block 231 is comprised of a plurality of capacitors that are stacked on edge with their leads oriented in the vertical direction as shown in greater detail in FIG. 5. In this example, the longitudinal dimension of capacitor block 231 is greater than the lateral and vertical dimensions of the capacitor block, such that capacitor block 231 is rectangular in form.

Inverter assembly 300 includes capacitor block 231, first insulator 302, first bus bar 304, second insulator 306, second bus bar 308, and power cards 310. First insulator 302 and second insulator 306 may be comprised of FR-4 (e.g., composite glass-reinforced epoxy) or other known insulator. First bus bar 304 and second bus bar 308 may be comprised of two-layer copper material. Capacitor block 231 may be formed by stacking a plurality of film capacitors as shown in FIG. 5.

The thickness of inverter assembly 300 is measured in the vertical direction as indicated at leader 360. The length of inverter assembly 300 is measured in the longitudinal direction as indicated at leader 362. The width of inverter assembly 300 is measured in the lateral direction as indicated at leader 364.

Figure 4:
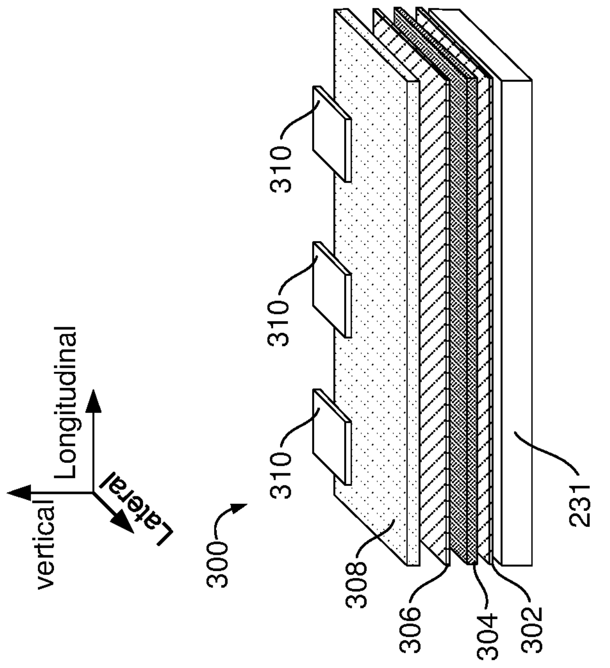
FIGS. 3-6 show an inverter capacitor and bus bars according to the present description.

In this example, first bus bar 304 is a positive polarity bus bar and second bus bar 308 is a negative polarity bus bar; however, in other examples, first bus bar 304 may be negative polarity bus bar and second bus bar 308 may be a positive polarity bus bar. FIG. 4 is an exploded view of inverter assembly 300.

Figure 5:
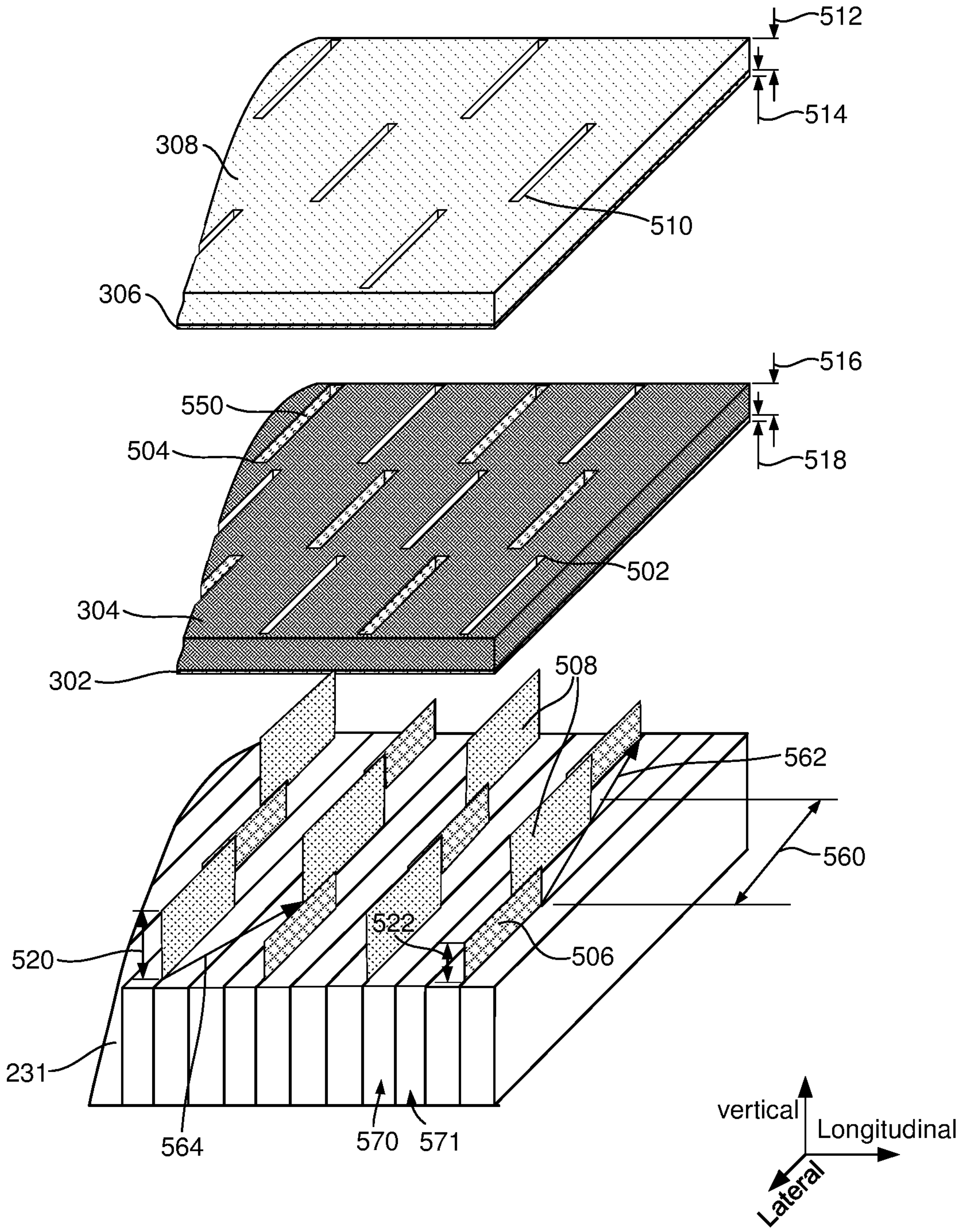

Referring now to FIG. 5 a detailed exploded view of portion of inverter assembly 300 is shown. In this exploded view, leads and pass through holes or slots are shown. Additionally, dimensions of leads with respect to bus bars is shown.

FIG. 5 shows individual adjacent capacitors 570 and 571 stacked to form part of capacitor block 231. Positive leads for the capacitors are indicated as shown at 506. Negative leads for capacitors are indicated as shown at 508. Each capacitor cell includes a single positive lead and a single negative lead. The vertical height (length) of positive capacitor leads is indicated by leader 522. The vertical height (length) of negative capacitor leads is indicated by leader 520. It may be possible that positive lead length may be greater than negative lead length if the position of the positive bus bar and the negative bus bar are swapped. The length of the negative leads is equal to or less than the thickness of the first insulator indicated at 518, plus the thickness of the positive bus bar indicated at 516, plus the thickness of the second insulator indicated at 514, and plus the thickness of the negative bus bar indicated at 512. The length of the negative leads is also greater than the thickness of the first insulator indicated at 518 plus the thickness of the positive bus bar indicated at 516. The length of the positive leads is less than the thickness of the first insulator indicated at 518 plus the thickness of the positive bus bar indicated at 516.

Positive leads of adjacent capacitors are offset diagonally as indicated by arrow 562. The lateral distance offset is indicated by leader 560. Likewise, negative leads of adjacent capacitors are offset diagonally as indicated by arrow 564. First bus bar 304 includes insulator 550 in pass through holes or slots 504 for negative capacitor leads. First bus bar 304 also includes pass through holes or slots 502 for positive capacitor leads 506 that are not insulated because positive capacitor leads 506 may be welded to first bus bar 304. Second bus bar 308 includes pass through holes or slots 510 solely for negative capacitor leads 508 that are not insulated because negative capacitor leads 508 may be welded to second bus bar 308.

Figure 6:
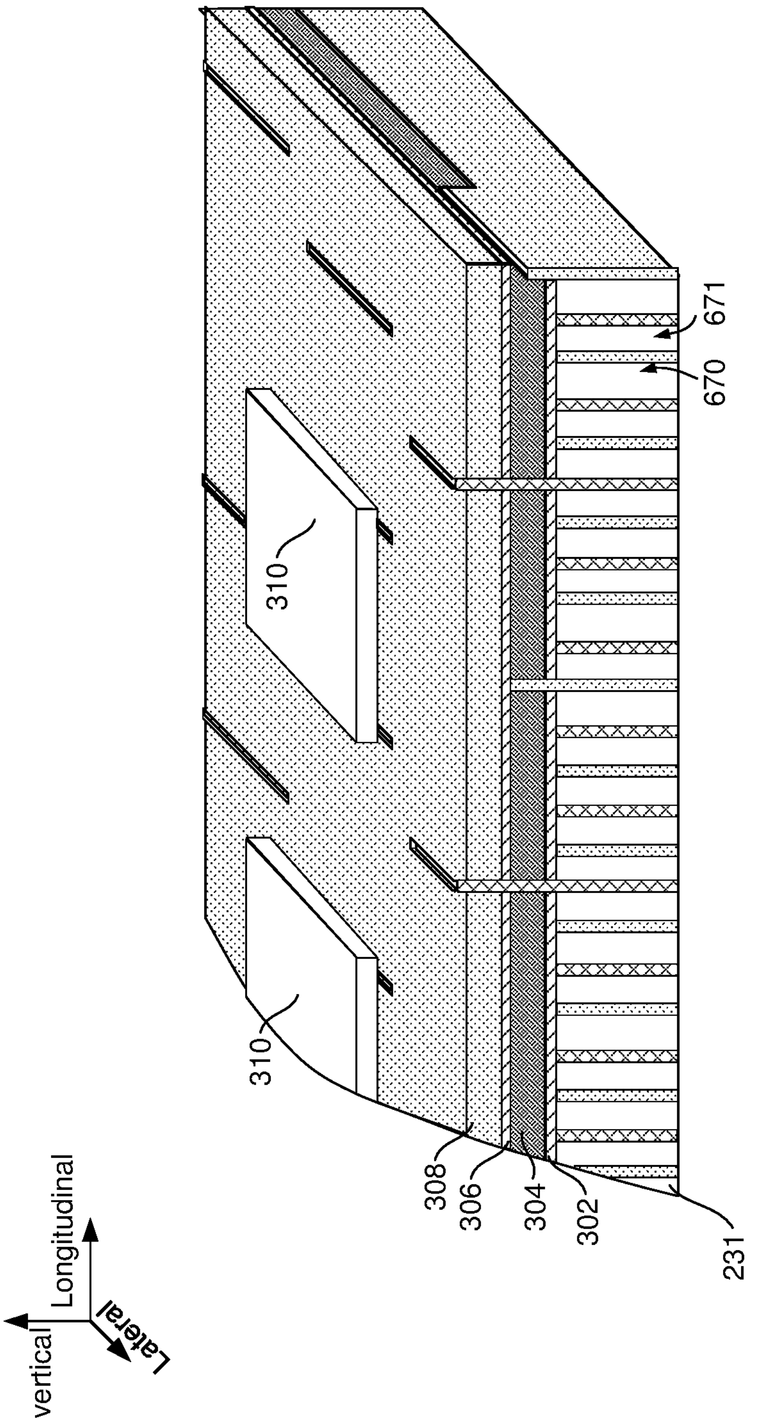

FIG. 6 shows a cut-away view of inverter assembly 300. A first capacitor cell 670 and a second capacitor cell 671 are shown adjacent to each other. The through holes for the first and second bus bars permit the capacitor leads to be close together, thereby reducing stray inductance and resistive heating.

It may be noted that each capacitor cell may be stacked so that adjacent capacitor cells share common positive leads and adjacent capacitor cells share common negative leads. This allows the actual total number of capacitor leads to be reduced and insulation between capacitor cells to be omitted.

Thus, the traction inverter of FIGS. 1-6 provides for a traction inverter, comprising: a plurality of stacked capacitors, each of the plurality of stacked capacitors including a positive lead and a negative lead; a first bus bar including pass through slots for the positive leads and negative leads of each of the plurality of stacked capacitors; and a second bus bar including pass through slots for solely the positive leads or for solely negative leads of each of the plurality of stacked capacitors. In a first example, the traction inverter further comprises a first insulator including pass through slots for the positive leads and negative leads of each of the plurality of stacked capacitors. In a second example that may include the first example, the traction inverter further comprises a second insulator including pass through slots for the solely positive leads or for solely negative leads of each of the plurality of stacked capacitors. In a third example that may include one or both of the first and second examples, the traction inverter includes where the first insulator is positioned between the plurality of stacked capacitors and the first bus bar. In a fourth example that may include one or more of the first through third examples, the traction inverter includes where the second insulator is positioned between the first bus bar and the second bus bar. In a fifth example that may include one or more of the first through fourth examples, the traction inverter further comprises insulation within at least a portion of the pass through slots of the first bus bar. In a sixth example that may include one or more of the first through fifth examples, the traction inverter further comprises a plurality of power cards directly coupled to the second bus bar.

The traction inverter assembly of FIGS. 1-6 also provides for a traction inverter, comprising: a plurality of stacked capacitors, positive leads of two adjacent stacked capacitors in the plurality of stacked capacitors offset diagonally from each other, and negative leads of the two adjacent stacked capacitors in the plurality of stacked capacitors offset diagonally from each other; a first insulator including slots that the positive leads and the negative leads are configured to pass through, the first insulator in contact with the plurality of stacked capacitors; a first bus bar including pass through slots for the positive leads and the negative leads, the first bus bar in contact with the first insulator; a second insulator including slots that solely the positive leads or solely the negative leads are configured to pass through, the second insulator in contact with the first bus bar; and a second bus bar including pass through slots for solely the positive leads or solely the negative leads, the second bus bar in contact with the second insulator. In a first example, the traction inverter further comprises insulators in a group of the slots. In a second example that may include the first example, the traction inverter includes where the insulators insulate the negative leads or the positive leads from the first bus bar. In a third example that may include one or both of the first and second examples, the traction inverter further comprises a plurality of power cards in physical contact with the second bus bar. In a fourth example that may include one or more of the first through third examples, the traction inverter includes where the plurality of power cards include one or more transistors (e.g., 211 of FIG. 2).

In another representation, the traction inverter assembly of FIGS. 1-6 provides for a traction inverter, comprising: a plurality of stacked capacitors, each of the plurality of stacked capacitors including a positive lead and a negative lead; a first bus bar including pass through slots for the positive lead and negative lead of each of the plurality of stacked capacitors; and a second bus bar including pass through slots for solely the positive leads or for solely negative leads of each of the plurality of stacked capacitors, and wherein each of the positive and negative leads of the plurality of stacked capacitor have a length that is less than a thickness of the of the first bus bar plus a thickness of the second bus bar plus a thickness of a first insulator between the first bus bar and the second bus bar plus a thickness of an insulator between the plurality of stacked capacitors and the first bus bar.

Figure 7:
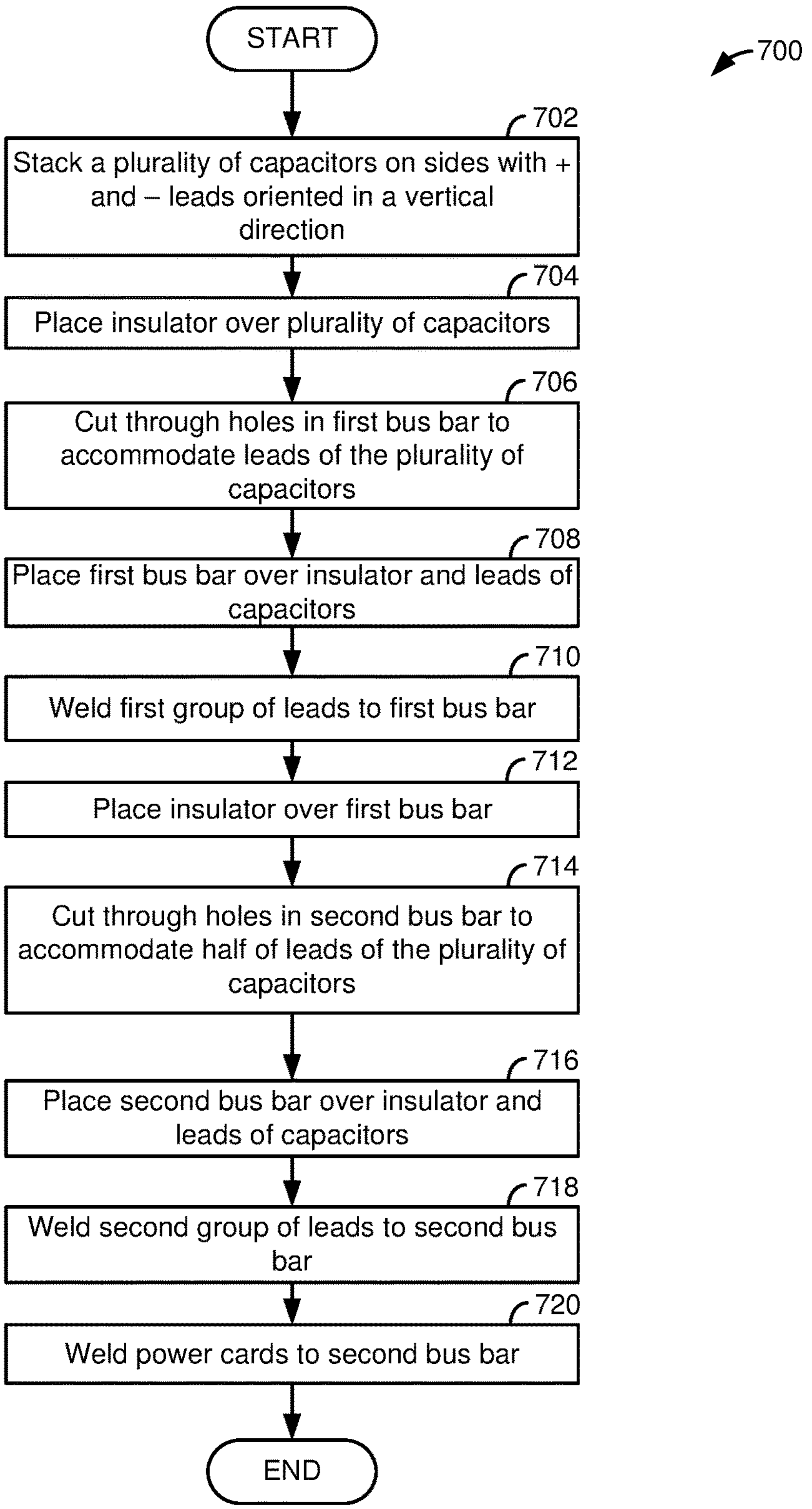
FIG. 7 shows a flow chart of a method for building an inverter.

Referring now to FIG. 7, a method for building a traction inverter that supplies power to an electric machine (e.g., a traction motor) is shown. The method of FIG. 7 may be part of an assembly process that is performed by humans and/or machines. The steps shown in FIG. 7 may be performed in the order recited or in an alternative order.

At 702, method 700 begins assembling a traction inverter by stacking a plurality of individual capacitors with each lead of each capacitor oriented in a same direction (e.g., vertical as shown in FIG. 5). The capacitors may be fastened together or they remain loosely stacked. The plurality of capacitors may be stacked to form a rectangular block of capacitors as shown in FIG. 5. The block allows the dimensions of the stack capacitors to be minimized, thereby reducing stray inductance and resistance. Method 700 proceeds to 704.

At 704, method 700 places a first insulator over the side of the capacitor block that includes the capacitor leads. The positive and negative capacitor leads pass through the first insulator as shown in FIG. 6. The first insulator is placed in physical contact with capacitors of the capacitor block. Method 700 proceeds to 706.

At 706, method 700 cuts through holes or slots (e.g., 502 and 504 of FIG. 5) in a first bus bar to accommodate positive and negative leads from each capacitor that makes up the capacitor block. Through holes for one type of capacitor lead (e.g., positive or negative lead) may be larger than the through holes for the other type of capacitor lead (e.g., positive or negative lead). The through holds may be arranged as shown in FIG. 5 to reduce space between the leads while retaining isolation between positive and negative leads. Method 700 proceeds to 708.

At 708, method 700 places the first bus bar over the first insulator so that the first insulator is sandwiched between the capacitor block and the first bus bar. The positive and negative leads of each capacitor pass into the slots or through holes that are cut into the first bus bar. Method 700 proceeds to 710.

At 710, if the first bus bar is a positive bus bar, the positive leads of the capacitor are welded to the first bus bar. If the first bus bar is a negative bus bar, the negative leads of the capacitor are welded to the first bus bar. The capacitor leads that are not welded to the first bus bar pass through the first bus bar. The capacitor leads that pass through the first bus bar are electrically isolated from the first bus bar via insulation. Method 700 proceeds to 712.

At 712, method 700 places a second insulator over the first bus bar and the leads that pass through the first bus bar. The capacitor leads also pass through the second insulator. The second insulator is in physical contact with the first bus bar so that the first bus bar is sandwiched between the first insulator and the second insulator as shown in FIG. 6. Method 700 proceeds to 714.

At 714, method 700 cuts through holes or slots (e.g., 510 of FIG. 5) in a second bus bar to accommodate leads positive or negative leads from each capacitor that makes up the capacitor block. The through holds may be arranged as shown in FIG. 5 to reduce space between the leads while retaining isolation between positive and negative leads. Method 700 proceeds to 716.

At 716, method 700 places the second bus bar over the second insulator so that the second insulator is sandwiched between the first bus bar and the second bus bar. The positive or negative leads of each capacitor pass into the slots or through holes that are cut into the second bus bar. The second bus bar has one half of the through holes of the first bus bar for capacitor leads. Method 700 proceeds to 718.

At 718, if the second bus bar is a positive bus bar, the positive leads of the capacitor are welded to the second bus bar. If the second bus bar is a negative bus bar, the negative leads of the capacitor are welded to the second bus bar. Each capacitor of the capacitor block is electrically coupled to the negative bus bar and the positive bus bar. Method 700 proceeds to 720.

At 720, method 700 welds the power cards to the second bus bar. The power cards may be welded to the second bus bar as shown in FIG. 6. Method 700 proceeds to exit.

Thus, the method of FIG. 7 provides for a method for a traction inverter, comprising: assembling a plurality of capacitors in a stack; placing a first insulator in contact with the stack; placing a first bus bar in contact with the first insulator; placing a second insulator in contact with the first bus bar; placing a second bus bar in contact with the second insulator; and placing a plurality of power cards in contact with the second bus bar. In a first example, the method includes where placing the first insulator in contact with the stack includes placing a plurality of capacitor leads through the first insulator. In a second example that may include the first example, the method includes where placing the first bus bar in contact with the first insulator includes placing the plurality of capacitor leads through the first bus bar. In a third example that may include one or both of the first and second examples, the method includes where placing the second insulator in contact with the first bus bar includes placing a group of the plurality of capacitor leads through the second insulator. In a fourth example that may include one or more of the first through third examples, the method includes where placing the second bus bar in contact with the second insulator includes placing the group of the plurality of capacitor leads through the second bus bar. In a fifth example that may include one or more of the first through fourth examples, the method further comprises welding a plurality of leads from the plurality of capacitors to the first bus bar. In a sixth example that may include one or more of the first through fifth examples, the method further comprises welding a plurality of leads from the plurality of capacitors to the second bus bar. In a seventh example that may include one or more of the first through sixth examples, the method includes where the first bus bar includes a length that is substantially equal to a length of the second bus bar.

The method of FIGS. 1-6 also provides for a traction inverter, comprising: a plurality of stacked capacitors, positive leads of two adjacent stacked capacitors in the plurality of stacked capacitors offset diagonally from each other, and negative leads of the two adjacent stacked capacitors in the plurality of stacked capacitors offset diagonally from each other; a first insulator including slots that the positive leads and the negative leads are configured to pass through, the first insulator in contact with the plurality of stacked capacitors; a first bus bar including pass through slots for the positive leads and the negative leads, the first bus bar in contact with the first insulator; a second insulator including slots that the solely the positive leads or solely the negative leads are configured to pass through, the second insulator in contact with the first bus bar; and a second bus bar including pass through slots for solely the positive leads or solely the negative leads, the second bus bar in contact with the second insulator. In a first example, the traction inverter further comprises insulators in a group of the slots. In a second example that may include the first example, the traction inverter includes where the insulators insulate the negative leads or the positive leads from the first bus bar. In a third example that may include one or both of the first and second examples, the traction inverter further comprises a plurality of power cards in physical contact with the second bus bar. In a fourth example that may include one or more of the first through third examples, the traction inverter includes where the power cards include one or more transistors.

The manufacturing methods and routines disclosed herein may be stored as executable instructions in non-transitory memory and may be carried out by a manufacturing system including the controller in combination with the various sensors and actuators. Further, portions of the methods may be physical actions taken in the real world to change a state of a device. The specific routines described herein may represent one or more of any number of processing strategies such as event-driven, interrupt-driven, multi-tasking, multi-threading, and the like. As such, various actions, operations, and/or functions illustrated may be performed in the sequence illustrated, in parallel, or in some cases omitted. Likewise, the order of processing is not necessarily required to achieve the features and advantages of the examples described herein, but is provided for ease of illustration and description. One or more of the illustrated actions, operations and/or functions may be repeatedly performed depending on the particular strategy being used. Further, the described actions, operations and/or functions may graphically represent code to be programmed into non-transitory memory of the computer readable storage medium in the system, where the described actions are carried out by executing the instructions in a system including the various hardware components in combination with the electronic controller. One or more of the method steps described herein may be omitted if desired.

While various embodiments have been described above, it may be understood that they have been presented by way of example, and not limitation nor restriction. It will be appreciated that the configurations and routines disclosed herein are exemplary in nature, and that these specific examples are not to be considered in a limiting sense, because numerous variations are possible. For example, the above technology can be applied to powertrains that include different types of propulsion sources including different types of electric machines, internal combustion engines, and/or transmissions. The technology may be used as a stand-alone, or used in combination with other power transmission systems not limited to machinery and propulsion systems for tandem axles, electric tag axles, P4 axles, HEVs, BEVs, agriculture, marine, motorcycle, recreational vehicles and on and off highway vehicles, as an example. The subject matter of the present disclosure includes all novel and non-obvious combinations and sub-combinations of the various systems and configurations, and other features, functions, and/or properties disclosed herein. It will be apparent to persons skilled in the relevant arts that the disclosed subject matter may be embodied in other specific forms without departing from the spirit of the subject matter.

The following claims particularly point out certain combinations and sub-combinations regarded as novel and non-obvious. These claims may refer to "an" element or "a first" element or the equivalent thereof. Such claims may be understood to include incorporation of one or more such elements, neither requiring nor excluding two or more such elements. Other combinations and sub-combinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure. As used herein, the term "approximately" is construed to mean plus or minus five percent of the range, unless otherwise specified.

The invention claimed is:

1. A traction inverter, comprising:

a plurality of stacked capacitors, each of the plurality of stacked capacitors including a positive lead and a negative lead;

a first bus bar including pass through slots for the positive lead and negative lead of each of the plurality of stacked capacitors; and a second bus bar including pass through slots for solely the positive lead or for solely the negative lead of each of the plurality of stacked capacitors.

2. The traction inverter of claim 1, further comprising a first insulator including pass through slots for the positive lead and negative lead of each of the plurality of stacked capacitors.

3. The traction inverter of claim 2, further comprising a second insulator including pass through slots for solely the positive lead or solely for the negative lead of each of the plurality of stacked capacitors.

4. The traction inverter of claim 3, where the first insulator is positioned between the plurality of stacked capacitors and the first bus bar.

5. The traction inverter of claim 4, where the second insulator is positioned between the first bus bar and the second bus bar.

6. The traction inverter of claim 5, further comprising insulation within at least a portion of the pass through slots of the first bus bar.

7. The traction inverter of claim 6, further comprising a plurality of power cards directly coupled to the second bus bar.

8. A method for a traction inverter, comprising:

assembling a plurality of capacitors in a stack;

placing a first insulator in contact with the stack;

placing a first bus bar in contact with the first insulator;

placing a second insulator in contact with the first bus bar;

placing a second bus bar in contact with the second insulator; and placing a plurality of power cards in contact with the second bus bar.

9. The method of claim 8, where placing the first insulator in contact with the stack includes placing a plurality of capacitor leads through the first insulator.

10. The method of claim 9, where placing the first bus bar in contact with the first insulator includes placing the plurality of capacitor leads through the first bus bar.

11. The method of claim 10, where placing the second insulator in contact with the first bus bar includes placing a group of the plurality of capacitor leads through the second insulator.

12. The method of claim 11, where placing the second bus bar in contact with the second insulator includes placing the group of the plurality of capacitor leads through the second bus bar.

13. The method of claim 8, further comprising welding a plurality of leads from the plurality of capacitors to the first bus bar.

14. The method of claim 8, further comprising welding a plurality of leads from the plurality of capacitors to the second bus bar.

15. The method of claim 8, where the first bus bar includes a length that is substantially equal to a second bus bar length.

16. A traction inverter, comprising:

a plurality of stacked capacitors, positive leads of two adjacent stacked capacitors in the plurality of stacked capacitors offset diagonally from each other, and negative leads of the two adjacent stacked capacitors in the plurality of stacked capacitors offset diagonally from each other;

a first insulator including slots that the positive leads and the negative leads are configured to pass through, the first insulator in contact with the plurality of stacked capacitors;

a first bus bar including pass through slots for the positive leads and the negative leads, the first bus bar in contact with the first insulator;

a second insulator including slots that solely the positive leads or solely the negative leads are configured to pass through, the second insulator in contact with the first bus bar; and a second bus bar including pass through slots for solely the positive leads or solely the negative leads, the second bus bar in contact with the second insulator.

17. The traction inverter of claim 16, further comprising insulators in a group of the slots.

18. The traction inverter of claim 17, where the insulators insulate the negative leads or the positive leads from the first bus bar.

19. The traction inverter of claim 18, further comprising a plurality of power cards in physical contact with the second bus bar.

20. The traction inverter of claim 19, where the plurality of power cards include one or more transistors.

* * * * *